US012635532B2

(12) United States Patent
Arndt

(10) Patent No.: US 12,635,532 B2
(45) Date of Patent: May 19, 2026

(54) OPTOELECTRONIC COMPONENT AND METHOD FOR PRODUCING AN OPTOELECTRONIC COMPONENT

(71) Applicant: ams-OSRAM International GmbH, Regensburg (DE)

(72) Inventor: Karlheinz Arndt, Bad Abbach (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 714 days.

(21) Appl. No.: 17/923,291

(22) PCT Filed: Apr. 30, 2021

(86) PCT No.: PCT/EP2021/061412
§ 371 (c)(1),
(2) Date: Nov. 4, 2022

(87) PCT Pub. No.: WO2021/224130
PCT Pub. Date: Nov. 11, 2021

(65) Prior Publication Data
US 2023/0230850 A1 Jul. 20, 2023

(30) Foreign Application Priority Data
May 4, 2020 (DE) .................... 10 2020 205 590.4

(51) Int. Cl.
*H01L 21/48* (2006.01)
*H01L 21/60* (2006.01)
(Continued)

(52) U.S. Cl.
CPC ...... *H01L 21/4825* (2013.01); *H01L 21/4896* (2013.01); *H01L 21/60* (2021.08);
(Continued)

(58) Field of Classification Search
CPC ............. H01L 21/4825; H01L 21/4896; H01L 21/60; H01L 25/10; H01L 25/167;
(Continued)

(56) References Cited

U.S. PATENT DOCUMENTS 4,984,057 A 1/1991 Mii
6,936,855 B1 8/2005 Harrah
(Continued)

FOREIGN PATENT DOCUMENTS

| DE | 102 34 102 A1 | 2/2004 |
| EP | 0 364 806 A2 | 4/1990 |
| EP | 2 919 280 A1 | 9/2015 |
| JP | H11-145505 A | 5/1999 |

OTHER PUBLICATIONS

International Search Report issued for corresponding International Patent Application No. PCT/EP2021/061412, on Jul. 27, 2021, along with an English translation (6 pages).
(Continued)

*Primary Examiner* — Christine S. Kim
*Assistant Examiner* — Andrew Victor Prostor
(74) *Attorney, Agent, or Firm* — Hauptman Ham, LLP

(57) ABSTRACT

An optoelectronic component includes a first housing body and a second housing body separate from the first housing body. A first section of a leadframe is embedded into the first housing body. A second section of the leadframe connected integrally the first section, is embedded into the second housing body.

7 Claims, 9 Drawing Sheets

(51) Int. Cl.
  *H01L 25/10*        (2006.01)
  *H01L 25/16*        (2023.01)
  *H10H 20/01*        (2025.01)
  *H10H 20/857*       (2025.01)

(52) U.S. Cl.
  CPC ............ *H01L 25/10* (2013.01); *H01L 25/167*
      (2013.01); *H01L 2021/60007* (2013.01); *H10H*
        *20/036* (2025.01); *H10H 20/0364* (2025.01);
                      *H10H 20/857* (2025.01)

(58) Field of Classification Search
  CPC ....... H01L 2021/60007; H01L 21/4821–4842;
              H01L 23/495–49596; H10H 20/857;
              H10H 20/036; H10H 20/0364; H10H
                                      20/8506
  See application file for complete search history.

(56)                References Cited

U.S. PATENT DOCUMENTS

2005/0271391 A1* 12/2005 Togami .................. H04B 10/40
                                                    398/164
2013/0207144 A1*  8/2013 Ramchen ................ H10F 77/50
                                                    257/432

OTHER PUBLICATIONS

Written Opinion issued for corresponding International Patent Application No. PCT/EP2021/061412, on Jul. 27, 2021, along with an English translation (7 pages).

* cited by examiner

OPTOELECTRONIC COMPONENT AND METHOD FOR PRODUCING AN OPTOELECTRONIC COMPONENT

CROSS REFERENCE TO RELATED APPLICATION

This application is a National Stage of International Application No. PCT/EP2021/061412, filed on Apr. 30, 2021, which designates the United States and was published in Europe, and which claims priority to German Patent Application No. 10 2020 205 590.4, filed on May 4, 2020, in the German Patent Office. Both of the aforementioned applications are hereby incorporated by reference in their entireties.

The present invention relates to an optoelectronic component and to a method for producing an optoelectronic component.

Optoelectronic components comprising optoelectronic semiconductor chips are known from the prior art. Optoelectronic components are known which can emit electromagnetic radiation in a direction parallel to a mounting plane. It is likewise known, in the case of optoelectronic components, to integrate further electronic semiconductor chips besides optoelectronic semiconductor chips.

One object of the present invention is to provide an optoelectronic component. A further object of the present invention is to specify a method for producing an optoelectronic component. These objects are achieved by means of an optoelectronic component and by means of a method for producing an optoelectronic component having the features of the independent claims. Various developments are specified in the dependent claims.

An optoelectronic component comprises a first housing body and a second housing body, which is separate from the first housing body. A first section of a leadframe is embedded into the first housing body. A second section of the leadframe, which section is connected integrally to the first section, is embedded into the second housing body.

Advantageously, the first housing body and the second housing body of this optoelectronic component can accommodate different component parts of the optoelectronic component. In this case, an electrically conductive connection mediated by the leadframe can exist between said component parts. In the case of this optoelectronic component, the leadframe advantageously produces both a mechanical and an electrical connection between the first housing body and the second housing body. The separate configuration of the first housing body and the second housing body advantageously allows the first housing body and the second housing body of the optoelectronic component to be oriented in different spatial directions.

In one embodiment of the optoelectronic component, the first housing body has a top side, an underside situated opposite its top side, a first side surface connecting its top side to its underside, and a second side surface situated opposite its first side surface. The second housing body has a top side, an underside situated opposite its top side, a first side surface connecting its top side to its underside, and a second side surface situated opposite its first side surface. The first housing body has a first cavity which is open to the top side of said housing body. The second housing body has a second cavity which is open to the top side of said housing body. The top side of the second housing body is oriented perpendicularly to the top side of the first housing body. For example, the first cavity of the first housing body of said optoelectronic component can be oriented in a direction perpendicular to a mounting plane, while the second cavity of the second housing body is oriented parallel to the mounting plane.

In one embodiment of the optoelectronic component, a first contact section of the leadframe emerges from the first housing body on the second side surface of the first housing body and is bent over toward the underside of the first housing body. A part of the first contact section, said part being oriented parallel to the underside of the first housing body, forms a first soldering contact surface of the optoelectronic component. The underside of the first housing body of said optoelectronic component therefore forms part of a mounting side of the optoelectronic component. That part of the first contact section which is bent over toward the underside of the first housing part and is oriented parallel to the underside of the first housing body can then advantageously serve for the electrical contacting of the optoelectronic component. The optoelectronic component is therefore suitable, for example, for surface mounting.

In one embodiment of the optoelectronic component, the first contact section is bent at two points by 90° in each case. Advantageously, the first contact section then extends from the second side surface of the first housing body around the outer side of the first housing body to the underside of the first housing body.

In one embodiment of the optoelectronic component, a second contact section of the leadframe emerges from the second housing body on the first side surface of the second housing body and is bent over in an orientation parallel to the first side surface. In this case, the second contact section of the leadframe forms a second soldering contact surface of the optoelectronic component. The first side surface of the second housing body of said optoelectronic component therefore forms part of the mounting side of the optoelectronic component. The second contact section of the leadframe, said contact section forming the second contact surface, permits electrical contacting of the optoelectronic component. The optoelectronic component can thereby be suitable, for example, for surface mounting.

In one embodiment of the optoelectronic component, a third section of the leadframe, said section being arranged between the first section and the second section of the leadframe, is bent by 90° about an axis which is parallel to a lateral plane of the leadframe. This advantageously permits the first housing body and the second housing body of the optoelectronic component to be oriented in different spatial directions.

In one embodiment of the optoelectronic component, the second housing body has a recess on an edge between its second side surface and its underside. In this case, the third section of the leadframe is arranged in the recess. This advantageously permits a particularly compact and space-saving relative arrangement of the first housing body and the second housing body of the optoelectronic component. The recess makes it possible in particular for the second housing body to be rotated with respect to the first housing body in such a manner that the first side surface of the second housing body is arranged parallel and coplanar to the underside of the first housing body.

In one embodiment of the optoelectronic component, the third section of the leadframe has a constriction. In this case, the third section of the leadframe is bent in the region of the constriction. Advantageously, the constriction can simplify the bending of the third section of the leadframe. It can advantageously be ensured by means of the constriction that the third section of the leadframe is bent at a desired point of the third section of the leadframe.

In one embodiment of the optoelectronic component, an electronic semiconductor chip is arranged in the first cavity of the first housing body and an optoelectronic semiconductor chip is arranged in the second cavity of the second housing body. In this case, the leadframe electrically conductively connects the electronic semiconductor chip and the optoelectronic semiconductor chip to each other. By means of the arrangement of the electronic semiconductor chip of said optoelectronic component in the first cavity of the first housing part, the second housing body of said optoelectronic component can advantageously be configured with particularly compact external dimensions. As a result, the optoelectronic component as a whole can have compact external dimensions.

In one embodiment of the optoelectronic component, the electronic semiconductor chip is configured to drive the optoelectronic semiconductor chip. In this case, the electronic semiconductor chip can be configured, for example, to control whether the optoelectronic semiconductor chip emits electromagnetic radiation. The electronic semiconductor chip can also be configured to control a brightness of electromagnetic radiation emitted by the optoelectronic semiconductor chip.

A method for producing an optoelectronic component comprises steps for providing a leadframe, for forming a first housing body and a second housing body, which is separate from the first housing body, wherein a first section of a leadframe is embedded into the first housing body, and a second section of the leadframe, said section being connected integrally to the first section, is embedded into the second housing body.

Advantageously, this method provides a simple and cost-effective possibility of producing an optoelectronic component which has two housing bodies which are separate from each other. In this case, the housing bodies of the optoelectronic component obtainable by this method are advantageously mechanically and electrically conductively connected to each other via the leadframe.

In one embodiment of the method, the latter comprises a further step for arranging an electronic semiconductor chip in a first cavity of the first housing body, said cavity being open to a top side of the first housing body, and an optoelectronic semiconductor chip in a second cavity of the second housing body, said cavity being open to a top side of the second housing body. Advantageously, the arrangement of the optoelectronic semiconductor chip and the arrangement of the electronic semiconductor chip can take place in a common processing procedure in the case of this method. As a result, the method can advantageously be carried out simply and cost-effectively. Electrical contacting of the electronic semiconductor chip and of the optoelectronic semiconductor chip, for example contacting via bond wires, can also take place in a common processing step for both chips.

In one embodiment of the method, the latter comprises further steps for determining an individual parameter of the optoelectronic semiconductor chip and for storing the individual parameter in the electronic semiconductor chip. This advantageously permits the electronic semiconductor chip of the optoelectronic component obtainable by the method to drive the optoelectronic semiconductor chip depending on the individual parameter. The individual parameter can be, for example, a luminosity of the optoelectronic semiconductor chip and can be determined by means of a measurement, for example. The individual parameter can be stored, for example, in a volatile or nonvolatile data memory of the electronic semiconductor chip. It is also possible for a plurality of individual parameters or for a set of associated individual parameters of the optoelectronic semiconductor chip to be stored in the electronic semiconductor chip, for example one or more characteristics of the optoelectronic semiconductor chip.

In one embodiment of the method, the latter comprises a further step for bending over a third section of the leadframe, said section being arranged between the first section and the second section of the leadframe, by 90° about an axis which is parallel to a lateral plane of the leadframe. As a result, the second housing body is advantageously rotated in relation to the first housing body by 90°. In the case of the optoelectronic component obtainable by the method, the first housing body and the second housing body are therefore oriented at an angle of 90° relative to each other.

In one embodiment of the method, a fixing section of the leadframe, said fixing section being arranged outside the first housing body and the second housing body, is held in place while the third section of the leadframe is being bent over, and the first housing body is moved relative to the fixing section. Advantageously, this permits particularly simple bending over of the third leadframe section.

In an alternative embodiment of the method, a fixing section of the leadframe, said fixing section being arranged outside the first housing body and the second housing body, is held in place while the third section of the leadframe is being bent over, and the second housing body is moved relative to the fixing section. This method also permits the third section of the leadframe to be bent over in such a manner that the second housing body is rotated in relation to the first housing body by 90°.

In one embodiment of the method, the latter comprises a further step for bending over a first contact section of the leadframe, said contact section emerging from the first housing body on a second side surface of the first housing body, toward an underside of the first housing body. In this case, a part of the first contact section, said part being oriented parallel to the underside of the first housing body, forms a first soldering contact surface of the optoelectronic component. Advantageously, by means of this method, soldering contact surfaces of the optoelectronic component can be formed from the leadframe. As a result, the optoelectronic component obtainable by the method can be suitable, for example, for surface mounting.

In one embodiment of the method, the first contact section is bent at two points by 90° in each case. As a result, the first contact section is bent from the second side surface of the first housing body around the first housing body as far as the underside of the first housing body.

In one embodiment of the method, the latter comprises a further step for bending over a second contact section of the leadframe, said contact section emerging from the second housing body on a first side surface of the second housing body, in an orientation parallel to the first side surface. In this case, the second contact section of the leadframe forms a second soldering contact surface of the optoelectronic component. Advantageously, as a result, a direct electrical connection to the second housing body of the optoelectronic component obtainable by the method is provided.

The above-described properties, features and advantages of this invention and the way in which they are achieved will become clearer and more clearly understood in association with the following description of the exemplary embodiments which are explained in greater detail in association with the drawings. Here, in a schematic illustration in each case:

Figures 1, 2:
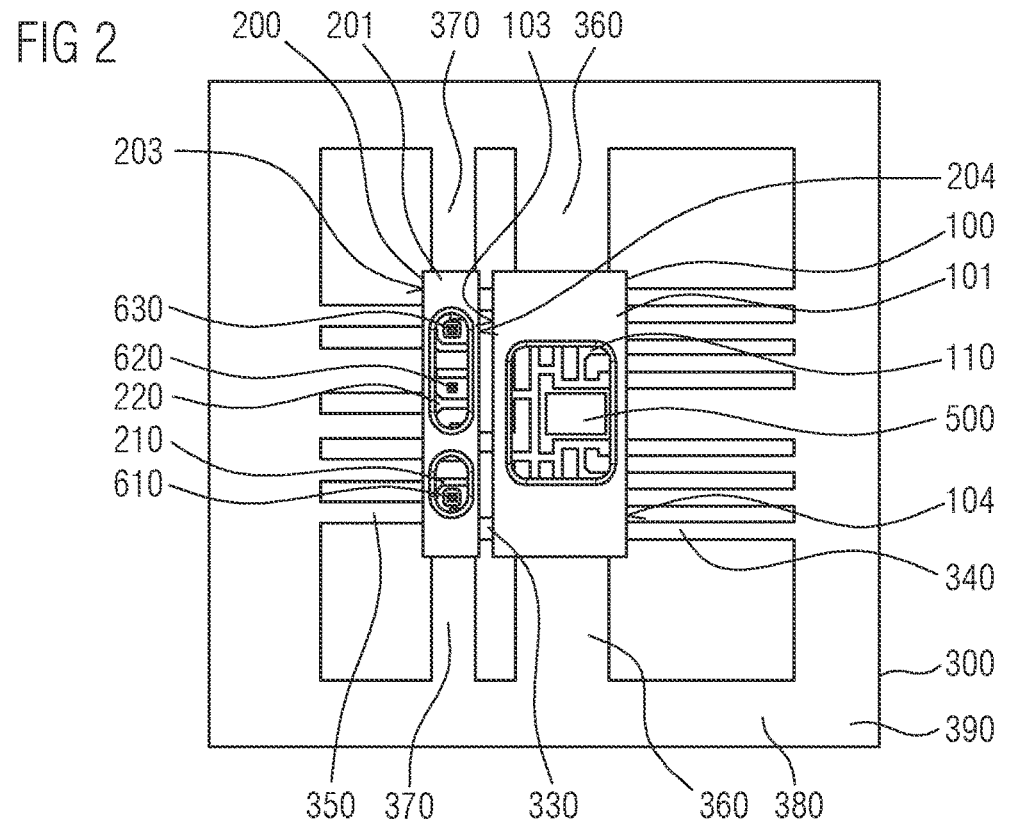
FIG. 1 shows a plan view of a leadframe.
FIG. 2 shows a plan view of the leadframe and two housing bodies formed thereon.

FIG. 1 shows a plan view of a top side of a leadframe 300. The leadframe 300 is manufactured from a thin metal sheet which extends in a lateral plane 301. The top side of the leadframe 300 is oriented parallel to the lateral plane 301 of the leadframe 300.

The leadframe 300 comprises an electrically conductive material, for example a metal. The leadframe 300 can be manufactured, for example, from a thin metal sheet. The leadframe 300 has clearances, by means of which individual sections of the leadframe 300 are at least partially separated from one another. However, all of the sections of the leadframe 300 are integrally connected to one another by an encircling outer frame 390 of the leadframe 300. In the example shown in FIG. 1, the outer frame 390 has a rectangular and approximately square contour.

Figure 3:
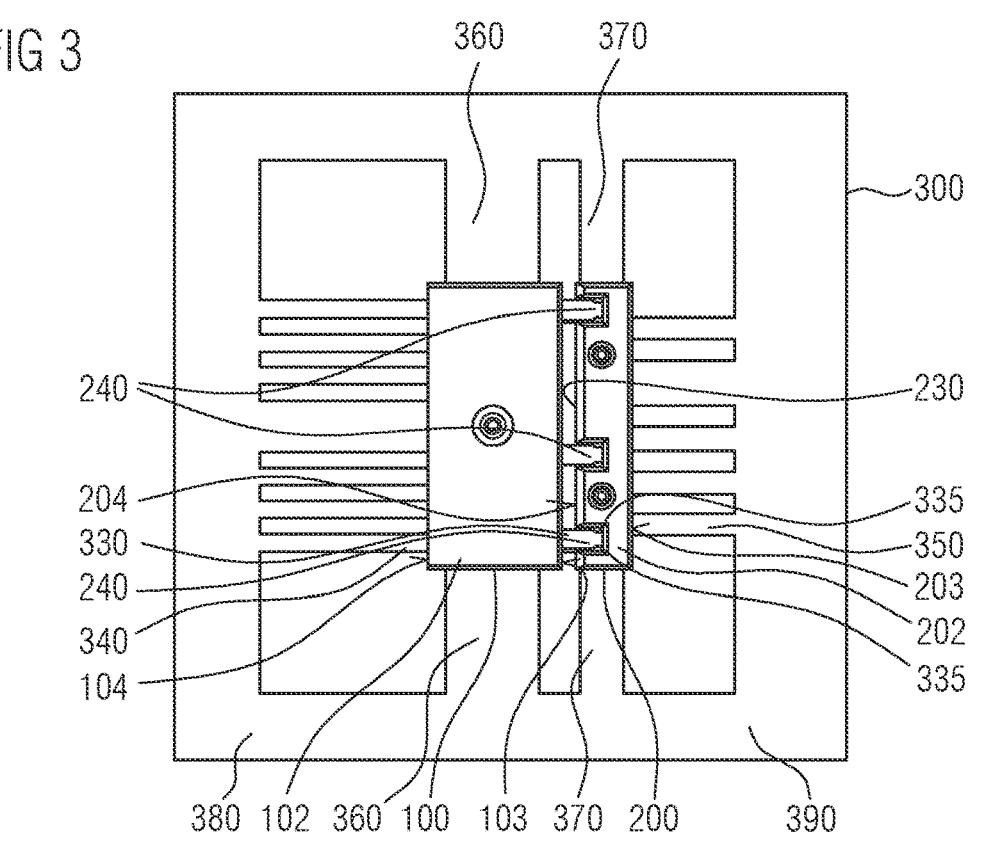
FIG. 3 shows a view of the leadframe and of the housing bodies from below.

FIG. 2 shows a plan view of the top side of the leadframe 300 in a processing state temporally successive to the illustration in FIG. 1. FIG. 3 shows a view of an underside of the leadframe 300 situated opposite the top side, in the processing state shown in FIG. 2.

A first housing body 100 and a second housing body 200, which is separate from the first housing body 100, have been formed on the leadframe 300. The first housing body 100 and the second housing body 200 are spaced apart from each other and connected to each other only via the leadframe 300.

The first housing body 100 and the second housing body 200 have been produced by a molding method (mold method) and comprise a molding material (mold material), for example an epoxy. During the formation of the first housing body 100 and of the second housing body 200, the leadframe 300 has been partially deformed by the molding material in such a manner that the leadframe 300 has been partially embedded into the first housing body 100 and partially into the second housing body 200. Other parts of the leadframe 300 have not been embedded either into the first housing body 100 or into the second housing body 200.

The first housing body 100 has an approximately cuboidal basic shape with a top side 101, an underside 102 situated opposite the top side 101, a first side surface 103 and a second side surface 104 situated opposite the first side surface 103. The first side surface 103 and the second side surface 104 each extend from the top side 101 to the underside 102 of the first housing body 100 and are oriented approximately perpendicularly to the top side 101 and to the underside 102. The top side 101 of the first housing body 100 is oriented parallel to the top side of the leadframe 300. The underside 102 of the first housing body 100 is oriented parallel to the underside of the leadframe 300. The top side 101 and the underside 102 of the first housing body 100 are therefore also oriented parallel to the lateral plane 301 of the leadframe 300.

The first housing body 100 has a first cavity 110 which is open to the top side 101. In the first cavity 110, parts of the top side of the sections of the leadframe 300 that are embedded into the first housing body 100 are exposed.

The second housing body 200 likewise has an approximately cuboidal basic shape with a top side 201, an underside 202 situated opposite the top side 201, a first side surface 203 and a second side surface 204 situated opposite the first side surface 203. The top side 201 of the second housing body 200 is oriented parallel to the top side of the leadframe 300 and can be oriented in a coplanar manner to the top side 101 of the first housing body 100. The underside 202 of the second housing body 200 is oriented parallel to the underside of the leadframe 300 and can be oriented in a coplanar manner to the underside 102 of the first housing body 100. The top side 201 and the underside 202 of the second housing body 200 are therefore also oriented parallel to the lateral plane 301 of the leadframe 300. The first side surface 203 and the second side surface 204 of the second housing body 200 each extend from the top side 201 to the underside 202 of the second housing body 200 and are oriented substantially perpendicularly to the top side 201 and the underside 202.

The first housing body 100 and the second housing body 200 are arranged beside each other in parallel in such a manner that the first side surface 103 of the first housing body 100 is situated opposite the second side surface 204 of the second housing body 200.

The second housing body 200 has a second cavity 210 which is open to the top side 201 of said housing body, and a third cavity 220 which is open to the top side 201 of said housing body. The second cavity 210 and the third cavity 220 are arranged beside each other on the top side 201 of the second housing body 200. In the second cavity 210 and the third cavity 220, parts of the top side of the sections of the leadframe 300 that are embedded into the second housing body 200 are in each case exposed. It is possible to form the second housing body 200 with only one cavity 210 or with more than two cavities 210, 220.

A first section 310, which can be seen in FIG. 1, of the leadframe 300 has been embedded into the first housing body 100 in the processing state shown in FIGS. 2 and 3. Parts of the top side of the first section 310 of the leadframe 300 are exposed in the first cavity 110 of the first housing body 100.

A second section 320 of the leadframe 300 visible in the illustration of FIG. 1, said section being connected integrally to the first section 310, has been embedded into the second housing body 200 in the processing state shown in FIGS. 2 and 3. Parts of the top side of the second section 320 of the leadframe 300 are exposed in the second cavity 210 of the second housing body 200.

A third section 330 of the leadframe 300, said section being arranged between the first section 310 and the second section 320 and being joined together integrally with the first section 310 and the second section 320, is arranged between the first housing body 100 and the second housing body 200. The third section 330 of the leadframe 300 therefore mechanically connects the first housing body 100 and the second housing body 200 and also produces an electrically conductive connection between the first section 310 of the leadframe 300, said section being embedded into the first housing body 100, and the second section 320 of the leadframe 300, said section being embedded into the second housing body 200.

The leadframe 300 has further sections which are embedded in some sections into the first housing body 100 and in some sections into the second housing body 200 and connect the first housing body 100 to the second housing body 200. In the example shown in the figures, in addition to the third section 330 of the leadframe 300, two further webs extend between the first housing body 100 and the second housing body 200. However, there may also be more or fewer than three such connections.

The underside 202 of the second housing body 200 has a recess 240 which extends between the underside 202 and the second side surface 204 of the second housing body 200 over an edge 230 of the second housing body 200, said edge being formed between the underside 202 and the second side surface 204. The third section 330 of the leadframe 300, said section running between the first housing body 100 and the second housing body 200, is partially arranged in the recess 240. In the example shown in the figures, the second housing body 200 has further recesses in which the further sections of the leadframe 300 extending between the first housing body 100 and the second housing body 200 are arranged.

A first contact section 340 of the leadframe 300 is partially embedded into the first housing body 100. The first contact section 340 protrudes out of the first housing body 100 on the second side surface 104 of the first housing body 100. In the example shown in the figures, the leadframe 300 has further sections which are partially embedded into the first housing body 100 and protrude out of the first housing body 100 on the second side surface 104. The precise number of said sections of the leadframe 300 can be selected differently depending on the application.

A second contact section 350 of the leadframe 300 is partially embedded into the second housing body 200 and protrudes out of the second housing body 200 on the first side surface 203 of the second housing body 200. In the example shown in the figures, the leadframe 300 has further sections which are partially embedded into the second housing body 200 and protrude out of the second housing body 200 on the first side surface 203. The precise number of said sections of the leadframe 300 can be selected differently depending on the application.

The leadframe 300 furthermore has two first connection sections 360 which extend between the outer frame 390 and the first housing body 100 and are partially embedded into the first housing body 100. In this case, the first connection portions 360 protrude out of the first housing body 100 on two mutually opposite end sides which are oriented perpendicularly to the top side 101 and perpendicularly to the first side surface 103 of the first housing body 100. The first connection sections 360 of the leadframe 300 are used to provide mechanical stabilization during the processing.

In addition, in the example illustrated in the figures, the leadframe 300 has two second connection sections 370 which each extend between the second housing body 200 and the outer frame 390-360 of the leadframe 300. The second connection sections 370 are partially embedded into the second housing body 200 and protrude out of the second housing body 200 on two mutually opposite end sides which are oriented perpendicularly to the top side 201 and perpendicularly to the first side surface 203 of the second housing body 200. The second connection sections 370 are also used to provide mechanical stabilization while the described production steps are being carried out.

After the formation of the first housing body 100 and the second housing body 200, an electronic semiconductor chip 500 has been arranged in the first cavity 110 of the first housing body 100 and electrically conductively connected to sections of the leadframe 300. The electronic semiconductor chip 500 can have been arranged, for example, on the top side of a section of the leadframe 300, said top side being exposed in the first cavity 110 of the first housing body 100, and can have been connected via bond wires to further sections of the leadframe 300, said sections being accessible in the first cavity 110 of the first housing body 100. The bond wires are not illustrated in the figures for the sake of clarity. The electronic semiconductor chip 500 has been arranged in the first cavity 110 in such a manner that a lateral plane of the electronic semiconductor chip 500 is oriented parallel to the lateral plane 301 of the leadframe 300.

Furthermore, after formation of the first housing body 100 and the second housing body 200, a first optoelectronic semiconductor chip 610 has been arranged in the second cavity 210 of the second housing body 200 and a second optoelectronic semiconductor chip 620 and a third optoelectronic semiconductor chip 630 in the third cavity 220 of the second housing body 200. In this case, electrically conductive connections have also been produced in each case between the optoelectronic semiconductor chips 610, 620, 630 and sections of the leadframe 300, for example via electrically conductive soldering or adhesively bonding connections (chip bond connections) and via bond wires. The optoelectronic semiconductor chips 610, 620, 630 have been arranged in the second cavity 210 and the third cavity 220 of the second housing body 200 in such a manner that lateral planes of the optoelectronic semiconductor chips 610, 620, 630 are each oriented parallel to the lateral plane 301 of the leadframe 300.

The optoelectronic semiconductor chips 610, 620, 630 are each configured to emit electromagnetic radiation, for example visible light. The optoelectronic semiconductor chips 610, 620, 630 can be configured, for example, as light-emitting-diode chips (LED chips). Electromagnetic radiation emitted by the optoelectronic semiconductor chips 610, 620, 630 is in each case radiated in a direction perpendicular to the lateral plane of the respective optoelectronic semiconductor chips 610, 620, 630, i.e. also in a direction perpendicular to the top side 201 of the second housing body 200. In this case, the optoelectronic semiconductor chips 610, 620, 630 can be configured to emit light with wavelengths from different wavelength ranges in each case. For example, the first optoelectronic semiconductor chip 610 can be configured to emit light with a wavelength from the blue spectral range. The second optoelectronic semiconductor chip 620 can be configured, for example, to emit light with a wavelength from the red spectral range. The third optoelectronic semiconductor chip 630 can be configured, for example, to emit light with a wavelength from the green spectral range.

It is also possible for fewer than three optoelectronic semiconductor chips 610, 620, 630 or more than three optoelectronic semiconductor chips 610, 620, 630 to be provided. The optoelectronic semiconductor chips 610, 620, 630 can also be distributed between one or more cavities 210, 220 of the second housing body 200 in some other way.

The arrangement of the electronic semiconductor chip 500 in the first cavity 110 of the first housing body 100 and the arrangement of the optoelectronic semiconductor chips 610, 620, 630 in the cavities 210, 220 of the second housing body 200 can be undertaken in a common processing step. The production of the electrically conductive bond connections between the electronic semiconductor chip 500 and the leadframe 300 can also be undertaken in a common processing step with the production of the electrically conductive bond connections between the optoelectronic semiconductor chips 610, 620, 630 and the leadframe 300.

Each optoelectronic semiconductor chip 610, 620, 630 is electrically conductively connected to the electronic semiconductor chip 500 via the leadframe 300. For example, in the example shown in the figures, the first optoelectronic semiconductor chip 610 is electrically conductively connected to the electronic semiconductor chip 500 via the first section 310, the third section 330 and the second section 320. The electronic semiconductor chip 500 can be configured, for example, as a driver chip and provided to drive the optoelectronic semiconductor chips 610, 620, 630.

After the arrangement of the electronic semiconductor chip 500 in the first cavity 110 of the first housing body 100 and the electrical contacting of the electronic semiconductor chip 500, a potting material can have been arranged in the first cavity 110 in order to embed and to protect the electronic semiconductor chip 500. The potting material can be a silicone or an epoxy, for example.

In a corresponding manner, after the arrangement of the optoelectronic semiconductor chips 610, 620, 630 in the cavities 210, 220 of the second housing body 200 and after the contacting of the optoelectronic semiconductor chips 610, 620, 630, a potting material can have been arranged in the second cavity 210 and the third cavity 220 of the second housing body 200. It is expedient in this case if the potting material arranged in the second cavity 210 and the third cavity 220 comprises a high transparency for electromagnetic radiation emitted by the optoelectronic semiconductor chips 610, 620, 630.

The arrangement of the potting material in the first cavity 110 of the first housing body 100 can be undertaken in a common processing step with the arrangement of the potting material in the cavities 210, 220 of the second housing body 200.

The potting material is not illustrated in the figures for the sake of clarity.

Figure 4:
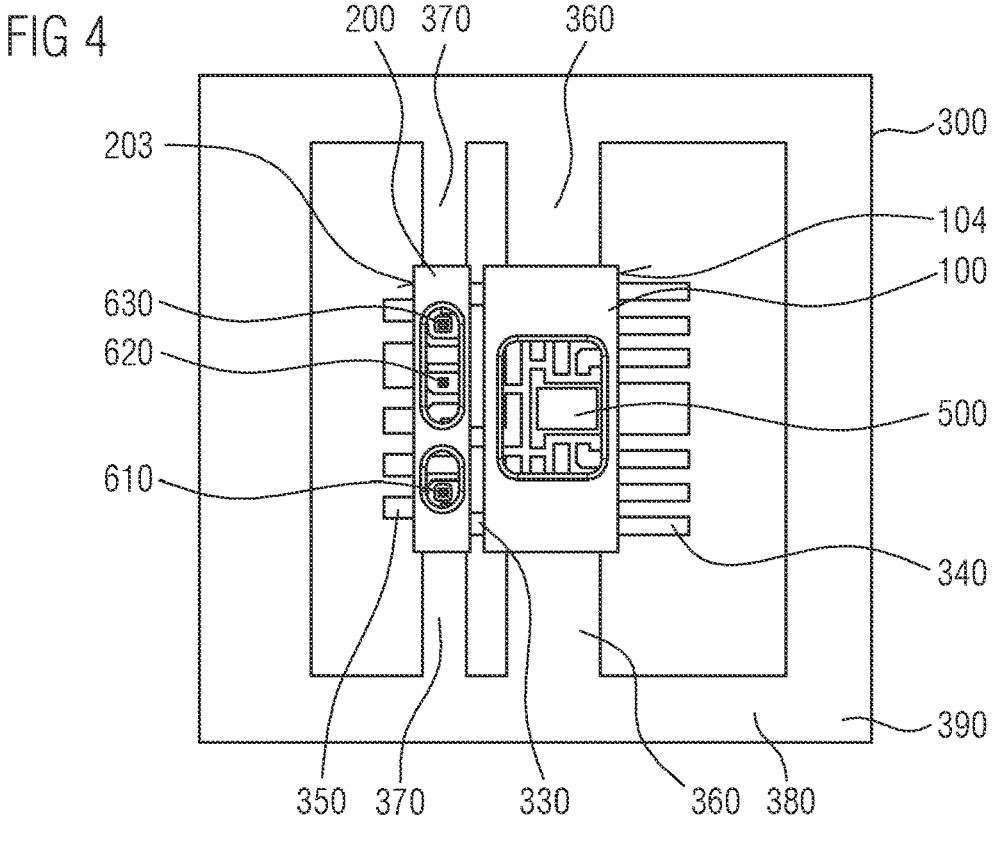
FIG. 4 shows a plan view of the leadframe after contact sections are severed.

FIG. 4 shows a plan view of the top side of the leadframe 300 and of the housing bodies 100, 200 in a processing state temporally successive to the illustration of FIGS. 2 and 3.

The connection of the first contact section 340, said contact section protruding out of the first housing body 100 on the second side surface 104 of the first housing body 100, to the outer frame 390 has been severed. The first contact section 340 is therefore only held by the fact that it is partially embedded in the first housing body 100. In a corresponding manner, the connections between the further sections of the leadframe 300, which sections protrude out of the first housing body 100 on the second side surface 104 of the first housing body 100, and the outer frame 390 of the leadframe 300 have also been severed.

The connection between the second contact section 350 and the outer frame 390 of the leadframe 300 has also been severed. The second contact section 350 protruding out of the second housing body 200 on the first side surface 203 of the second housing body 200 is therefore held only by the fact that it is partially embedded in the second housing body 200. The further sections of the leadframe 300, which sections protrude out of the second housing body 200 on the first side surface 203 of the second housing body 200, have also been correspondingly separated from the outer frame 390 of the leadframe 300.

Figure 5:
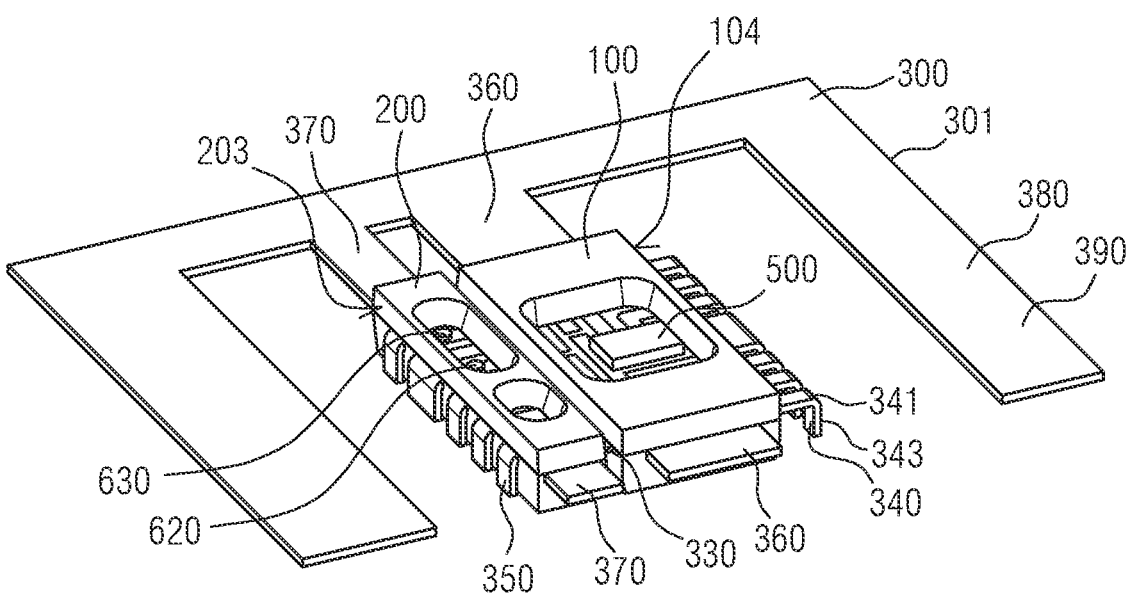
FIG. 5 shows a perspective and partially sectioned view of the leadframe and of the housing bodies after a first bending process.

FIG. 5 shows a perspective and partially sectioned view of the leadframe 300 and of the housing bodies 100, 200 in a processing state temporally successive to the illustration of FIG. 4. A part of the outer frame 390 and of the connection sections 360, 370 of the leadframe 300 is not shown in the illustration of FIG. 5 for the sake of clarity.

In a first bending process, that part of the first contact section 340 which protrudes out of the first housing body 100 has been bent over in a first bending region 341 by 90° such that a lower part 343 of the first bending region 341 is now oriented perpendicularly to the lateral plane 301, which is predetermined by the remaining sections of the leadframe 300, and points in the same spatial direction as the underside 102 of the first housing body 100. The remaining sections of the leadframe 300, which sections protrude out of the first housing body 100 on the second side surface 104, have been bent over in a corresponding manner.

In addition, during the first bending process, the second contact section 350 of the leadframe 300, which contact section emerges out of the second housing body 200 on the first side surface 203 of the second housing body 200, has been bent over by 90° into an orientation which is parallel to the first side surface 203 of the second housing body 200. The remaining sections of the leadframe 300, which sections protrude out of the second housing body 200 on the first side surface 203 of the second housing body 200, have been bent over in a corresponding manner.

Figure 6:
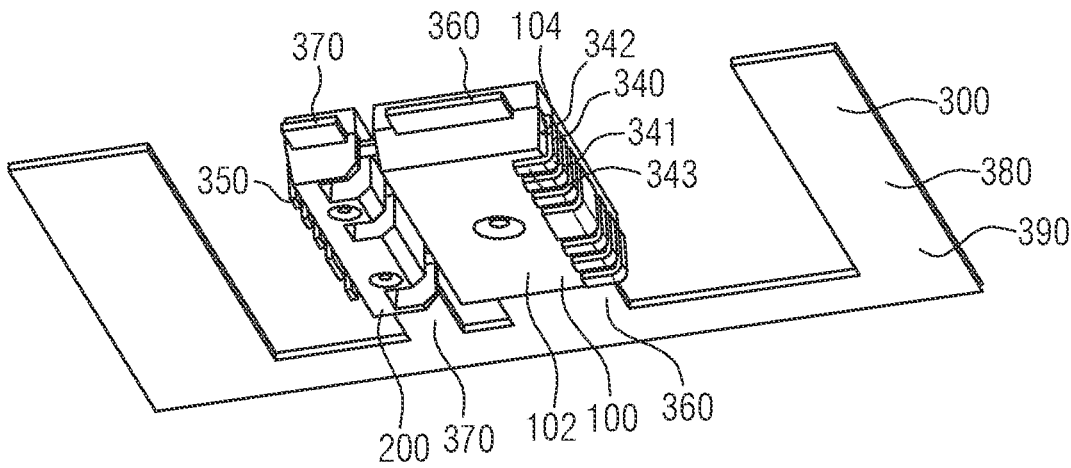
FIG. 6 shows a perspective and partially sectioned side view of the leadframe after a second bending process.

FIG. 6 shows a perspective and partially sectioned illustration of the leadframe 300 and of the housing bodies 100, 200 in a processing state temporally successive to the illustration of FIG. 5. In the illustration of FIG. 6, the leadframe 300 and the housing bodies 100, 200 are shown from below, and therefore the underside 102 of the first housing body 100 and the underside 202 of the second housing body 200 are visible.

In a second bending process, the first contact section 340 of the leadframe 300, said contact section emerging out of the first housing body 100 on the second side surface 104 of the first housing body 100, has been bent over again by 90° in a second bending region 342. As a result, the lower part 343 of the first contact section 340 is now arranged below the underside 102 of the first housing body 100 and oriented parallel to the underside 102 of the first housing body 100. The further sections of the leadframe 300, which sections protrude out of the first housing body 100 on the second side surface 104 of the first housing body 100, have been bent over a further time in a corresponding manner.

Figures 7, 8:
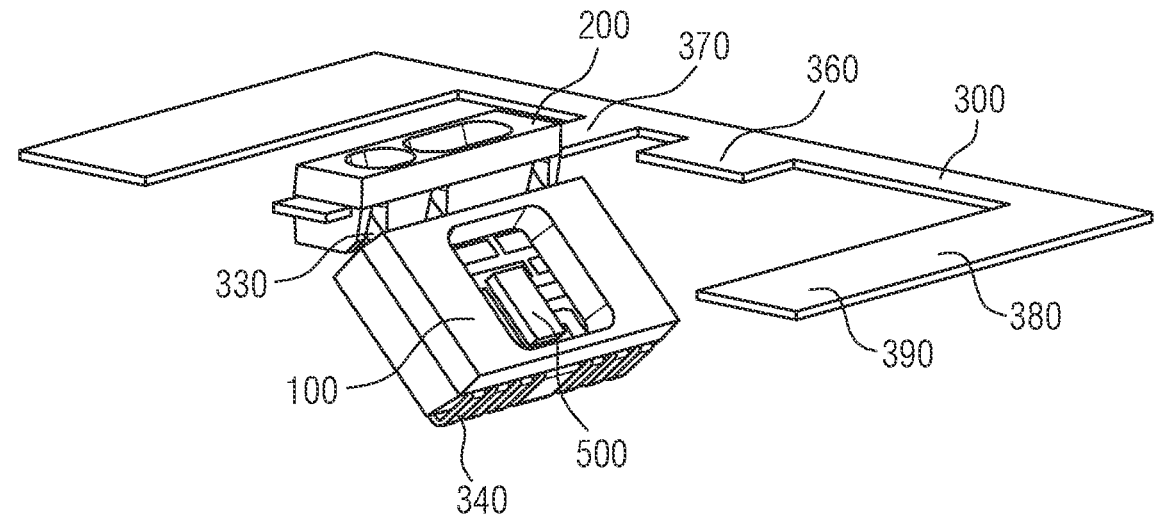
FIG. 7 shows a plan view of the leadframe after severing of first connection sections.
FIG. 8 shows a perspective and partially sectioned side view of the leadframe and of the housing bodies during a third bending process.

FIG. 7 shows a plan view of the leadframe 300 and the housing bodies 100, 200 in a processing state temporally successive to the illustration of FIG. 6.

The two first connection sections 360 of the leadframe 300 have been severed in such a manner that the first connection sections 360 now no longer form a mechanical connection between the first housing body 100 and the outer frame 390 of the leadframe 300. As a result, the first housing body 100 is only still connected to the second housing body 200 via the third section 330 of the leadframe 300 and the further sections of the leadframe 300, which sections extend between the first housing body 100 and the second housing body 200.

Figure 9:
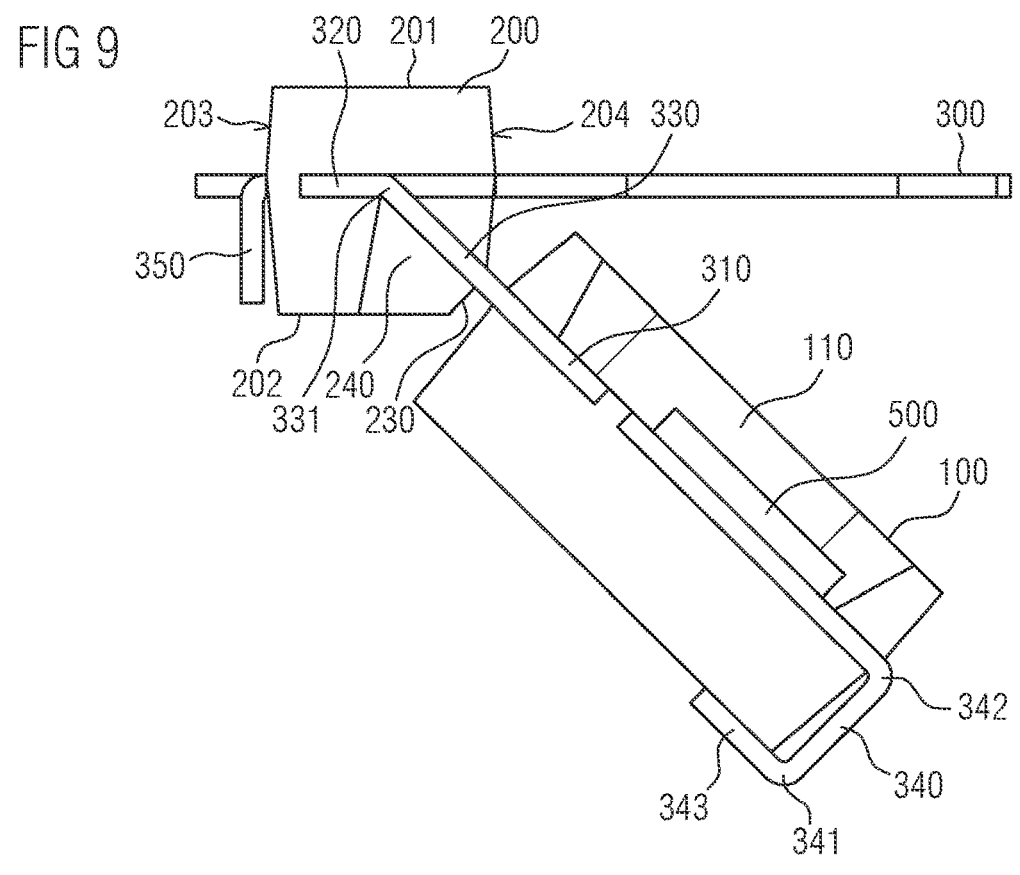
FIG. 9 shows a partially sectioned side view of the leadframe and of the housing bodies during the third bending process.

FIG. 8 shows a schematic, perspective and partially sectioned illustration of the leadframe 300 and of the housing bodies 100, 200 while a third bending process temporally successive to the illustration of FIG. 7 is being carried out. FIG. 9 shows a schematic and partially sectioned side view of the leadframe 300 and of the housing bodies 100, 200 while the third bending process is being carried out in the same processing state as FIG. 8.

In the third bending process, the third section 330 of the leadframe 300, said section being arranged between the first section 310 and the second section 320 of the leadframe 300, is bent by 90° about a bending axis 331 which is parallel to the lateral plane 301 of the leadframe 300. In the processing state shown in FIGS. 8 and 9, the bending process is not yet concluded. Only a bending about approximately 45° has been undertaken.

The bending axis 331 runs in the region of the recess 240 of the second housing body 200 in the vicinity of the transition region between the second section 320 and the third section 330 of the leadframe 300.

The further sections of the leadframe 300 that connect the housing body 100 to the second housing body 200 are bent over in the same manner as the third section 330 of the leadframe 300.

The third section 330 of the leadframe 300 is bent over by a fixing section 380 of the leadframe 300, the fixing section being arranged outside the first housing body 100 and the second housing body 200, being held in place, and the first housing body 100 being moved relative to the fixing section 380. The fixing section 380 can be, for example, the outer frame 390 of the leadframe 300. The movement of the first housing body 100 relative to the fixing section 380 is made possible by the fact that the first connection sections 360 have been severed beforehand and the first housing body 100 is connected to the second housing body 200 and to the fixing section 380 of the leadframe 300 only via those sections of the leadframe 300 which extend between the first housing body 100 and the second housing body 200. Since the second housing body 200 is mechanically rigidly connected to the fixing section 380 of the leadframe 300 via the second connection sections 370, the movement of the first housing body 100 relative to the fixing section 380 also causes the first housing body 100 to be moved relative to the second housing body 200.

Figure 10:
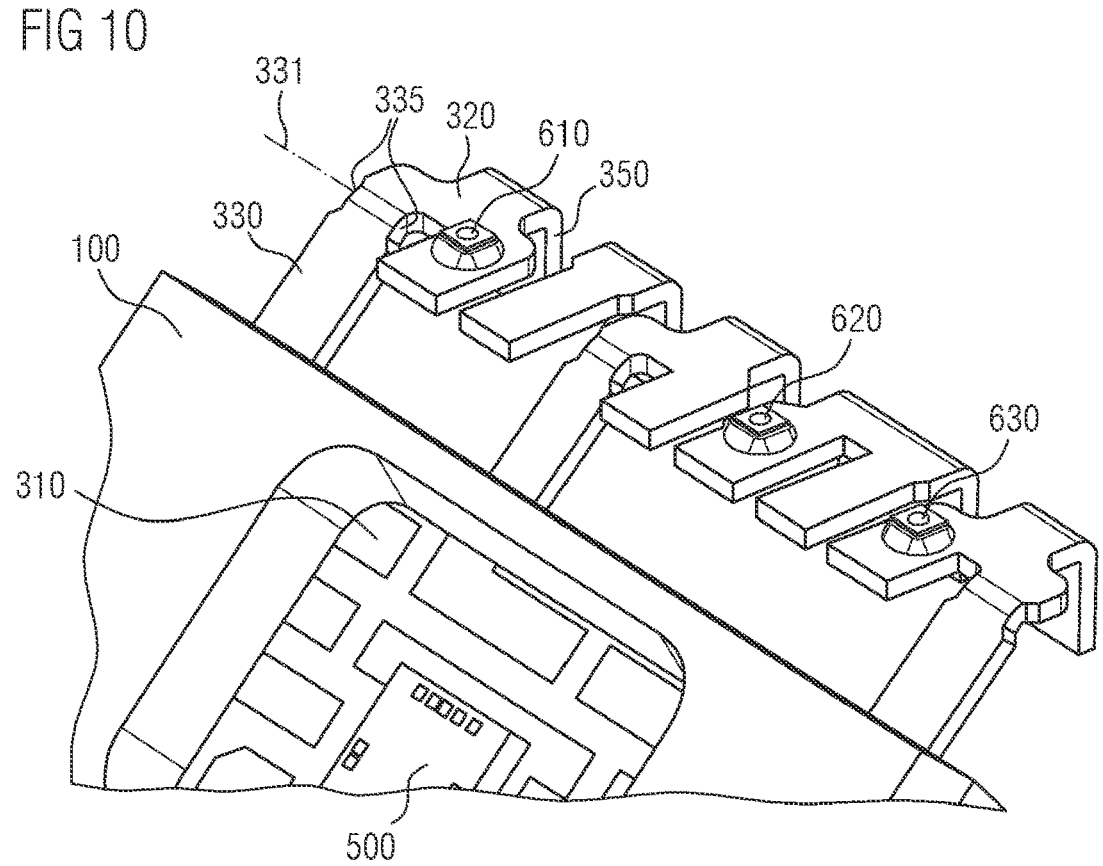
FIG. 10 shows a perspective and partially transparent illustration of the leadframe and of the housing bodies during the third bending process.

FIG. 10 shows a perspective illustration of part of the leadframe 300 and of the first housing body 100 in the processing state shown in FIGS. 8 and 9. In the illustration of FIG. 10, the second housing body 200 is not illustrated for the sake of clarity while the second section 320 of the leadframe 300, said section being embedded into the second housing body 200, and the other sections of the leadframe 300, said sections being embedded into the second housing body 200, are shown.

FIG. 10 shows that the third section 330 of the leadframe 300 has a constriction 335 in the vicinity of its connection to the second section 320 of the leadframe 300. In the region of the constriction 335, the third section 330 of the leadframe 300 is tapered in relation to the remaining sections thereof. This assists the third section 330 of the leadframe 300 being bent over in the region of the constriction 335 during the movement of the first housing body 100 relative to the fixing section 380 of the leadframe 300 while the remaining sections of the leadframe 300 are not bent. This means that the position of the bending axis 331 is secured by the position of the constriction 335 in such a manner that the bending axis 331 runs through the constriction 335 of the third section 330 of the leadframe 300. The remaining sections of the leadframe 300, said sections extending between the first housing body 100 and the second housing body 200, have corresponding constrictions, with the bending axis 331 also running through said constrictions. However, it is possible to omit the constriction 335 and the further constrictions.

Figure 11:
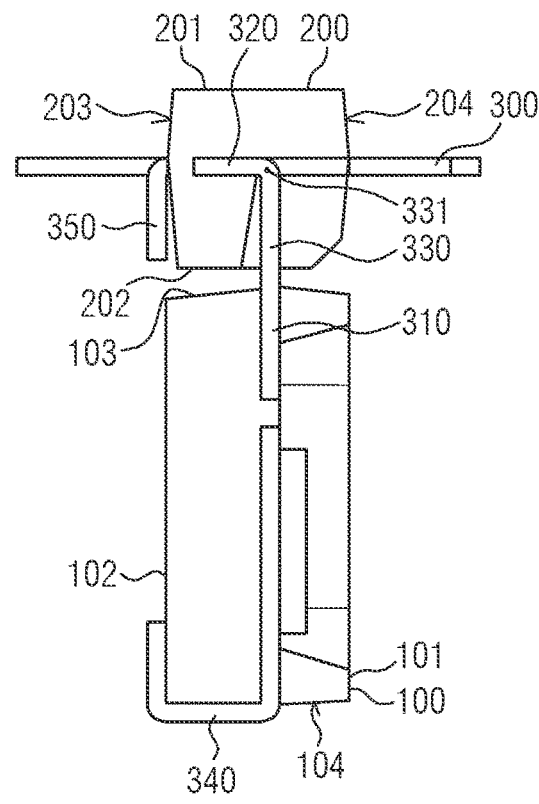
FIG. 11 shows a partially sectioned side view of the leadframe and of the housing bodies after the third bending process is concluded.
Figure 12:
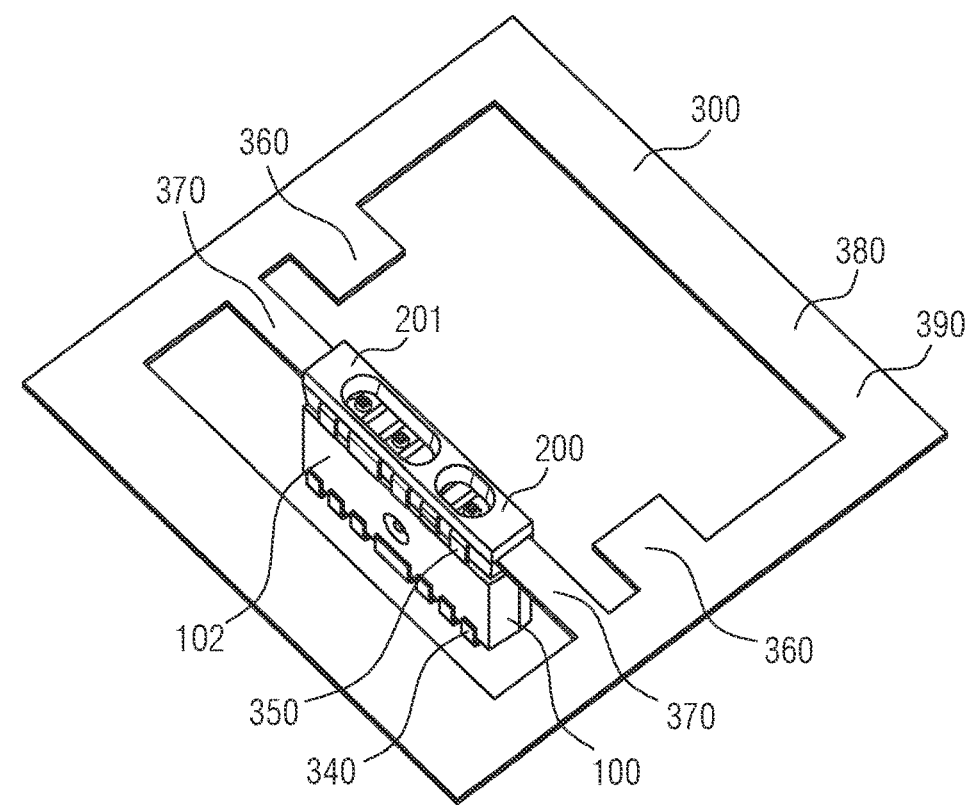
FIG. 12 shows a perspective illustration of the leadframe and of the housing bodies after the third bending process is concluded.

FIG. 11 shows a sectioned side view of the leadframe 300 and of the housing bodies 100, 200 in a processing state after the third bending process has been concluded. FIG. 12 shows a perspective illustration of the leadframe 300 and of the housing bodies 100, 200 in the same processing state as FIG. 11.

By means of the third bending process, the third section 330 of the leadframe 300 has been bent by 90° around the bending axis 331. As a result, the first housing body 100 and the second housing body 200 are now tilted by 90° in relation to each other in such a manner that the top side 201 of the second housing body 200 is oriented perpendicularly to the top side 101 of the first housing body 100. The first side surface 103 of the first housing body 100 and the underside 202 of the second housing body 200 now face each other. The underside 102 of the first housing body 100 and the first side surface 203 of the second housing body 200 point in a common spatial direction. Similarly, the top side 101 of the first housing body 100 and the second side surface 204 of the second housing body 200 point in a common spatial direction. The top side 201 of the second housing body 200 points away from the first housing body 100.

It is expedient if a thickness of the second housing body 200, as measured between the first side surface 203 and the second side surface 204 of the second housing body 200, approximately corresponds to a height of the first housing body 100, as measured between the top side 101 and the underside 102 of the first housing body 100, as is illustrated in the figures. This makes it possible for the first side surface 203 of the second housing body 200 to be arranged approximately in a common plane with the underside 102 of the first housing body 100, in the processing state shown in FIGS. 11 and 12, and at the same time for the second side surface 204 of the second housing body 200 to be arranged approximately in a common plane with the top side 101 of the first housing body 100. This arrangement of the first housing body 100 and of the second housing body 200 with respect to each other is made possible by the fact that the bent-over third section 330 of the leadframe 300 runs in the recess 240 of the second housing body 200. The further sections of the leadframe 300 that run between the first housing body 100 and the second housing body 200 are correspondingly arranged in further recesses of the second housing body 200.

Figure 13:
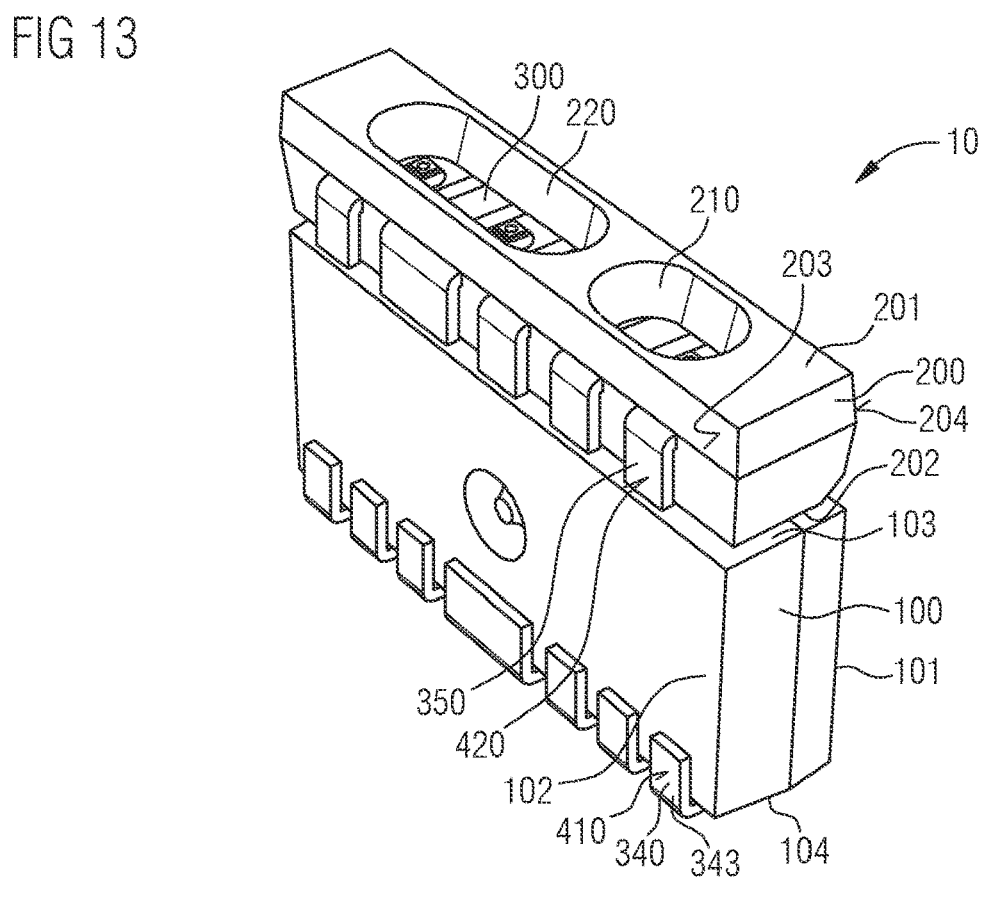
FIG. 13 shows an optoelectronic component, which is obtainable after second connection sections are severed, in a first perspective view.
Figure 14:
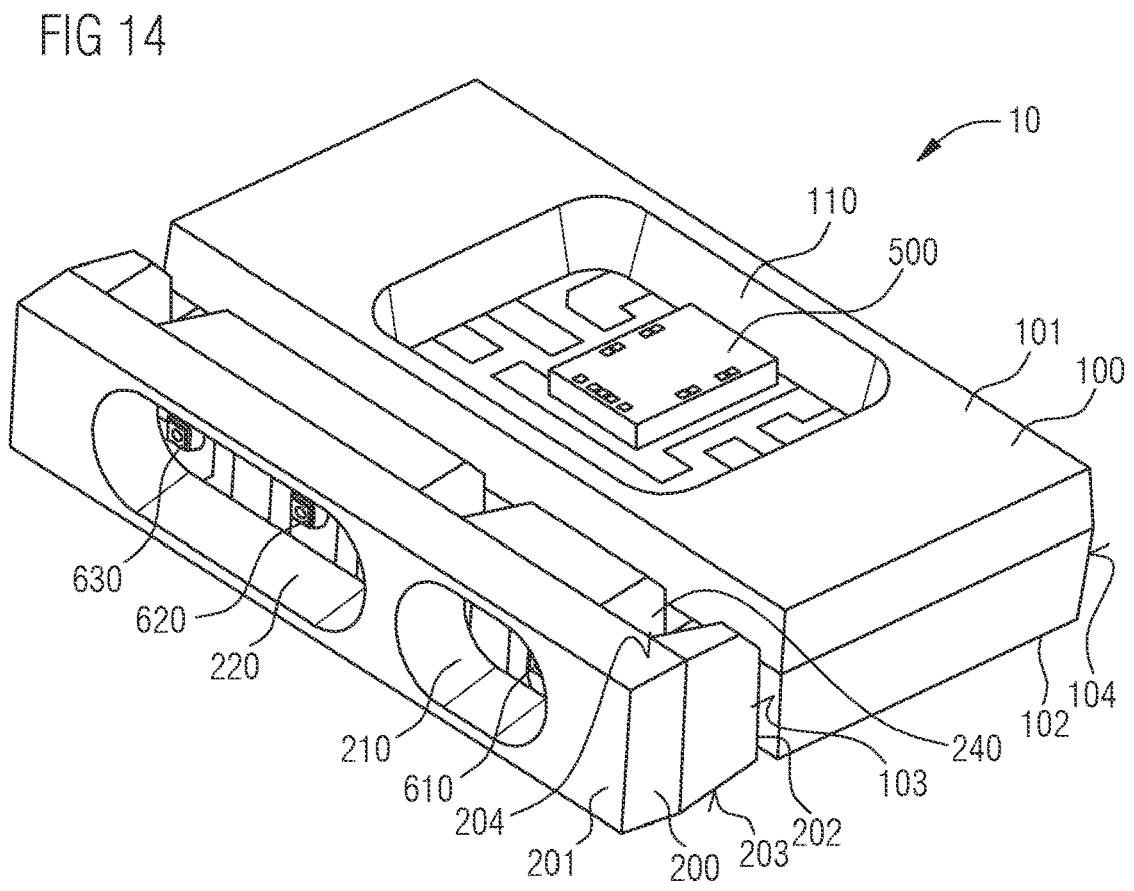
FIG. 14 shows the optoelectronic component in a second perspective view.

After the third bending process has been concluded, the second connection sections 370 are severed in order to separate the second housing body 200 from the outer frame 390 of the leadframe 300. By this means, an optoelectronic component 10, which is illustrated perspectively from different viewing directions in FIGS. 13 and 14, is obtained. In the processing state shown in FIGS. 13 and 14, the production of the optoelectronic component 10 can be concluded.

The underside 102 of the first housing body 100 and the first side surface 203 of the second housing body 200 together form a mounting side of the optoelectronic component 10. That part 343 of the first contact section 340 which is oriented parallel to the underside 102 of the first housing body 100 forms a first soldering contact surface 410 of the optoelectronic component 10. The second contact section 350 of the leadframe 300 forms a second soldering contact surface 420 of the optoelectronic component 10. In a corresponding manner, the further sections of the leadframe 300, said sections emerging out of the first housing body 100 on the second side surface 104 of the first housing body 100 and being bent over toward the underside 102 of the first housing body 100, and the further sections of the leadframe 300, said sections emerging out of the second housing body 200 on the first side surface 203 of the second housing body 200 and being bent over in an orientation parallel to the first side surface 203, also form further soldering contact surfaces of the optoelectronic component 10.

The optoelectronic component 10 can be suitable, for example, for surface mounting. For this purpose, the mounting side of the optoelectronic component 10, said mounting side being formed by the underside 102 of the first housing body 100 and the first side surface 203 of the second housing body 200, is arranged on a mounting surface and makes contact via the first soldering contact surface 410, the second soldering contact surface 420 and the further soldering contact surfaces of the optoelectronic component 10.

The first soldering contact surface 410 and the further sections of the leadframe 300, said sections emerging out of the first housing body 100 on the second side surface 104 of the first housing body 100 and being bent over toward the underside 102 of the first housing body 100, can be used for the electrical driving and for the thermal coupling of the optoelectronic component 10. The second soldering contact surface 420 can be used, for example, for the thermal coupling of the optoelectronic component 10. The further sections of the leadframe 300, said sections emerging out of the second housing body 200 on the first side surface 203 of the second housing body 200 and being bent over in an orientation parallel to the first side surface 203, can likewise be used for the thermal coupling and/or for the electrical driving of the optoelectronic component 10.

The top side 201 of the second housing body 200 is oriented perpendicularly to the mounting side of the optoelectronic component 10, said mounting side being formed by the underside 102 of the first housing body 100 and the first side surface 203 of the second housing body 200. The main emission direction of the first optoelectronic semiconductor chip 610, of the second optoelectronic semiconductor chip 620 and of the third optoelectronic semiconductor chip 630 of the optoelectronic component 10 is therefore also oriented perpendicularly to the mounting side of the optoelectronic component 10.

A variant of the above-described method for producing the optoelectronic component 10 is explained below with reference to FIGS. 15 to 17. It is only described below how the variants of the production method differ. Otherwise, the above description of the production method also applies to the variants explained below.

Figure 15:
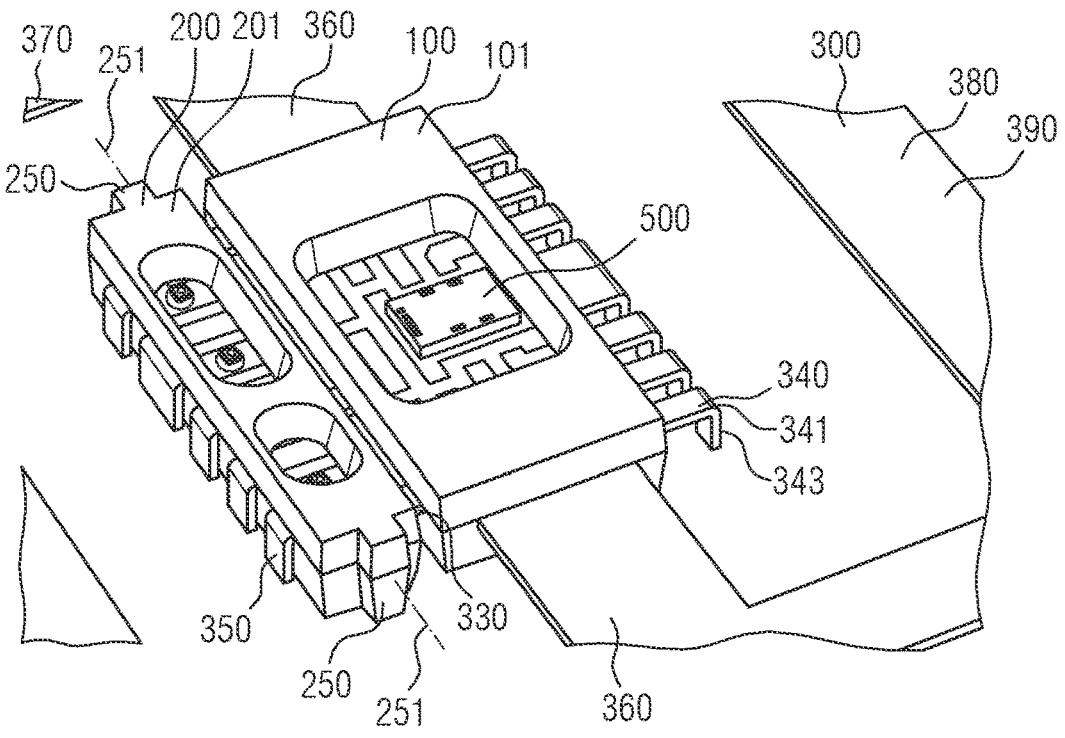
FIG. 15 shows a perspective view of the leadframe and of the housing bodies during an alternative variant of the production method.

FIG. 15 shows a perspective illustration of a part of the leadframe 300 and of the housing bodies 100, 200. The processing state shown in FIG. 15 corresponds to the processing state shown in FIG. 5 insofar as the first bending process for bending over the first contact section 340 in the first bending region 341 and for bending over the second contact section 350 has already been carried out. The second bending process for renewed bending of the first contact section 340 in the second bending region 342 has not yet been undertaken.

In addition, in the processing state shown in FIG. 15, the second connection sections 370 have been severed, and therefore the second housing body 200 is only still connected to the first housing body 100 via the third section 330 of the leadframe 300 and the further sections of the leadframe 300, said sections being arranged between the first housing body 100 and the second housing body 200, but is no longer directly connected to the outer frame 390 of the leadframe 300. In the processing state shown in FIG. 15, the first connection sections 360 of the leadframe 300 have not yet been severed, and therefore the first housing body 100 is still rigidly connected to the outer frame 390 of the leadframe 300.

In this variant of the production method, the second housing body 200 differs from the above-described variant of the production method in that the second housing body 200 has a respective engagement point 250 on its end sides oriented perpendicularly to the top side 201 and perpendicularly to the first side surface 203, at which engagement point a tool can engage.

Figure 16:
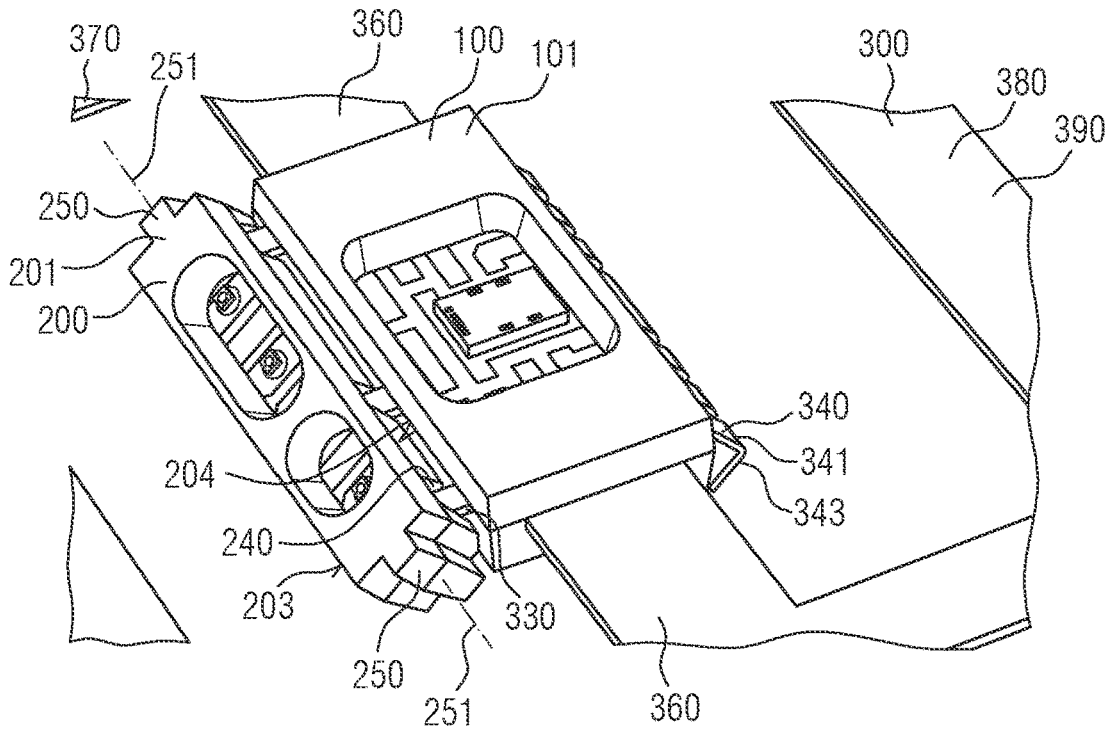
FIG. 16 shows a perspective illustration of the leadframe and of the housing bodies during a bending process.

FIG. 16 shows the leadframe 300, the first housing body 100 and the second housing body 200 while a bending process temporally successive to the illustration of FIG. 15 is being carried out. FIG. 17 shows the leadframe 300, the first housing body 100 and the second housing body 200 after said bending process has been concluded.

During the bending process illustrated in FIG. 16, the first contact section 340 is bent again by 90° in the second bending region 342 in such a manner that the lower part 343 of the first contact section 340 is finally arranged below the underside 102 of the first housing body 100 and oriented parallel to the underside 102 of the first housing body 100. To this extent, the bending process illustrated in FIG. 16 corresponds to the above-described second bending process.

At the same time, however, the third section 330 of the leadframe 300 is also bent by an angle of 90° at the bending axis 331. In the case of the bending process illustrated in FIG. 16, the third section 330 of the leadframe 300 is bent over by the fixing section 380 of the leadframe 300, said fixing section being arranged outside the first housing body 100 and the second housing body 200, being held in place, and the second housing body 200 being rotated relative to the fixing section 380 about an axis of rotation 251. The axis of rotation 251 is collinear here to the bending axis 331. By means of the rotation of the second housing body 200 relative to the fixing section 380 of the leadframe 300, the second housing body 200 is also rotated relative to the first housing body 100. By means of the rotation of the second housing body 200 by an angle of 90° about the axis of rotation 251, the third section 330 of the leadframe 300 is bent by an angle of 90° about the bending axis 331. The second housing body 200 can be rotated by means of a tool which engages on the engagement points 250 of the second housing body 200.

15

16

Figure 17:
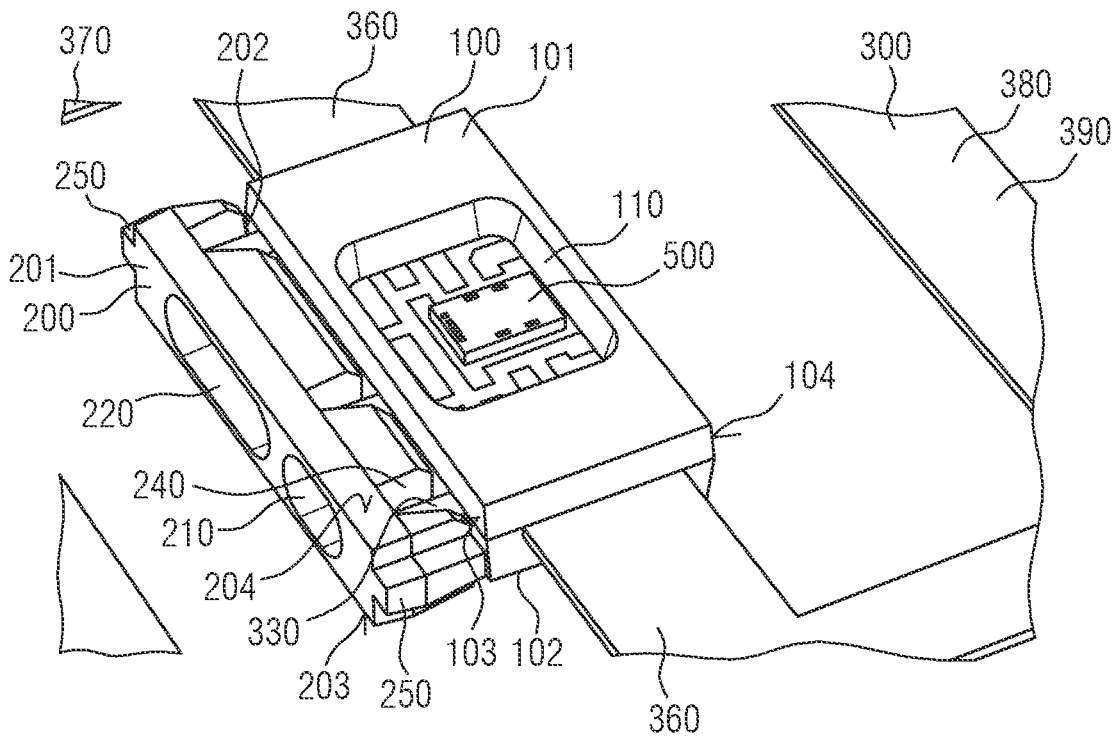
FIG. 17 shows a perspective view of the leadframe and of the housing bodies after the bending process is concluded.

In the processing state shown in FIG. 17, the first housing body 100 and the second housing body 200 are arranged relative to each other in such a manner that the top side 201 of the second housing body 200 is oriented perpendicularly to the top side 101 of the first housing body 100. The underside 202 of the second housing body 200 and the first side surface 103 of the first housing body 100 face each other.

Starting from the processing state shown in FIG. 17, the first connection sections 360 are severed in order to release the first housing body 100 from the outer frame 390 of the leadframe 300. The variant of the optoelectronic component 10 that is thus obtained corresponds to the variant of the optoelectronic component 10 that is described with reference to FIGS. 13 and 14.

Figure 18:
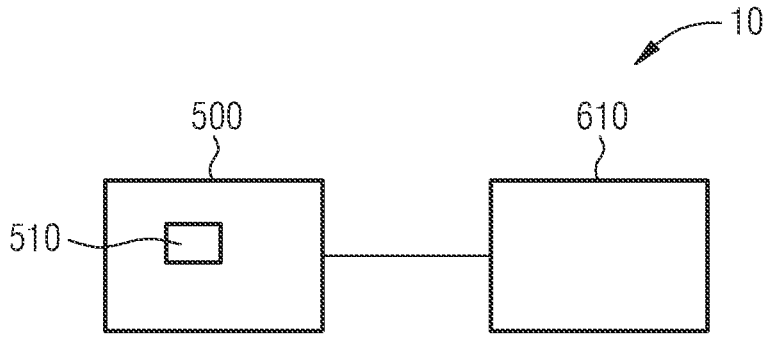
FIG. 18 shows a block diagram of the optoelectronic component.

FIG. 18 shows a highly schematic, simplified block diagram of the optoelectronic component 10. The electronic semiconductor chip 500 and the first optoelectronic semiconductor chip 610 are electrically conductively connected to each other in such a manner that the electronic semiconductor chip 500 can drive the first optoelectronic semiconductor chip 610. The electronic semiconductor chip 500 can be configured, for example, to drive the first optoelectronic semiconductor chip 610 in such a manner that the first optoelectronic semiconductor chip 610 emits light with a desired brightness.

An individual parameter 510 of the first optoelectronic semiconductor chip 610 can be stored in the electronic semiconductor chip 500. The individual parameter 510 specifies an individual characteristic of the first optoelectronic semiconductor chip 610. The individual parameter 510 can be, for example, a luminosity of the first optoelectronic semiconductor chip 610. The individual parameter 510 of the first optoelectronic semiconductor chip 610 can be determined by a measurement after the production of the optoelectronic component 10 and subsequently stored in the electronic semiconductor chip 500. For this purpose, the electronic semiconductor chip 500 can have, for example, a volatile or nonvolatile data memory. It is also possible for a plurality of individual parameters or for a set of associated individual parameters of the first optoelectronic semiconductor chip 610 to be stored in the electronic semiconductor chip 500, for example one or more characteristics of the first optoelectronic semiconductor chip 610.

The electronic semiconductor chip 500 can be configured to drive the first optoelectronic semiconductor chip 610 depending on the individual parameter 510. If the individual parameter 510 specifies, for example, a luminosity of the first optoelectronic semiconductor chip 610, the electronic semiconductor chip 500 can be configured in such a manner that the first optoelectronic semiconductor chip 610 is driven depending on the individual parameter 510 in such a manner that a brightness of electromagnetic radiation emitted by the first optoelectronic semiconductor chip 610 corresponds to a desired target value.

The electronic semiconductor chip 500 can be configured to drive the second optoelectronic semiconductor chip 620 and the third optoelectronic semiconductor chip 630 in a corresponding manner. Further individual parameters which relate to the second optoelectronic semiconductor chip 620 and to the third optoelectronic semiconductor chip 630 can be stored in the electronic semiconductor chip 500.

The invention has been illustrated and described in more specific detail on the basis of the preferred exemplary embodiments.

Nevertheless, the invention is not restricted to the examples disclosed. Rather, other variations can be derived therefrom by a person skilled in the art, without departing from the scope of protection of the invention.

LIST OF REFERENCE SIGNS

10 Optoelectronic component
100 First housing body
101 Top side
102 Underside
103 First side surface
104 Second side surface
110 First cavity
200 Second housing body
201 Top side
202 Underside
203 First side surface
204 Second side surface
210 Second cavity
220 Third cavity
230 Edge
240 Recess
250 Engagement point
251 Axis of rotation
300 Leadframe
301 Lateral plane
310 First section
320 Second section
330 Third section
331 Bending axis
335 Constriction
340 First contact section
341 First bending region
342 Second bending region
343 Lower part
350 Second contact section
360 First connection section
370 Second connection section
380 Fixing section
390 Outer frame
410 First soldering contact surface
420 Second soldering contact surface
500 Electronic semiconductor chip
510 Parameter
610 First optoelectronic semiconductor chip
620 Second optoelectronic semiconductor chip
630 Third optoelectronic semiconductor chip

The invention claimed is:

1. An optoelectronic component comprising a first housing body and a second housing body, which is separate from the first housing body, wherein a first section of a leadframe is embedded into the first housing body, and a second section of the leadframe, which section is connected integrally to the first section, is embedded into the second housing body, wherein a third section of the leadframe, said section being arranged between the first section and the second section of the leadframe, is bent by 90° about an axis which is parallel to a lateral plane of the leadframe, wherein the first housing body has a top side, an underside situated opposite its top side, a first side surface connecting its top side to its underside, and a second side surface situated opposite its first side surface, wherein the second housing body has a top side, an underside situated opposite its top side, a first side surface connecting its top side to its underside, and a second side surface situated opposite its first side surface, wherein the first housing body has a first cavity which is open to the top side of said housing body, wherein the second housing body has a second cavity which is open to the top side of said housing body, wherein the top side of the second housing body is oriented perpendicularly to the top side of the first housing body, wherein a first contact section of the leadframe emerges from the first housing body on the second side surface of the first housing body and is bent over toward the underside of the first housing body, and wherein a part of the first contact section, said part being oriented parallel to the underside of the first housing body, forms a first soldering contact surface of the optoelectronic component.

2. The optoelectronic component as claimed in claim 1, wherein the first contact section is bent at two points by 90° in each case.

3. The optoelectronic component as claimed in claim 1, wherein a second contact section of the leadframe emerges from the second housing body on the first side surface of the second housing body and is bent over in an orientation parallel to the first side surface, wherein the second contact section of the leadframe forms a second soldering contact surface of the optoelectronic component.

4. The optoelectronic component as claimed in claim 1, wherein the second housing body has a recess on an edge between its second side surface and its underside, wherein the third section of the leadframe is arranged in the recess.

5. The optoelectronic component as claimed in claim 1, wherein the third section of the leadframe has a constriction, wherein the third section of the leadframe is bent in the region of the constriction.

6. The optoelectronic component as claimed in claim 1, wherein an electronic semiconductor chip is arranged in the first cavity of the first housing body and an optoelectronic semiconductor chip is arranged in the second cavity of the second housing body, wherein the leadframe electrically conductively connects the electronic semiconductor chip and the optoelectronic semiconductor chip to each other.

7. The optoelectronic component as claimed in claim 6, wherein the electronic semiconductor chip is configured to drive the optoelectronic semiconductor chip.

* * * * *